US010333099B2

(12) United States Patent
Jung et al.

(10) Patent No.: US 10,333,099 B2
(45) Date of Patent: Jun. 25, 2019

(54) ORGANIC LIGHT-EMITTING DISPLAY APPARATUS

(71) Applicant: SAMSUNG DISPLAY CO., LTD., Yongin-si, Gyeonggi-Do (KR)

(72) Inventors: Jaeyoon Jung, Yongin-si (KR); Kwangchul Jung, Yongin-si (KR); Boogyo Shin, Yongin-si (KR); Hyunsuk Yang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/886,312

(22) Filed: Feb. 1, 2018

(65) Prior Publication Data

US 2019/0081272 A1 Mar. 14, 2019

(30) Foreign Application Priority Data

Sep. 11, 2017 (KR) ........................ 10-2017-0115907

(51) Int. Cl.
 *H01L 51/52* (2006.01)
(52) U.S. Cl.
 CPC ...... *H01L 51/5237* (2013.01); *H01L 51/5203* (2013.01)
(58) Field of Classification Search
 CPC ..................... H01L 51/5237; H01L 51/5203
 See application file for complete search history.

(56) References Cited

U.S. PATENT DOCUMENTS

| 8,134,678 | B2 | 3/2012 | Kim et al. | |
|---|---|---|---|---|
| 2007/0085112 | A1* | 4/2007 | Yamazaki | H01L 21/28008 257/288 |
| 2011/0122628 | A1* | 5/2011 | Han | H01L 51/5246 362/267 |
| 2012/0293064 | A1* | 11/2012 | Hong | H01L 51/5246 313/504 |
| 2015/0021568 | A1 | 1/2015 | Gong et al. | |
| 2015/0048344 | A1* | 2/2015 | Han | H01L 27/3258 257/40 |
| 2015/0364717 | A1* | 12/2015 | Lee | H01L 51/5253 257/40 |

(Continued)

FOREIGN PATENT DOCUMENTS

| JP | 2008-096836 | 4/2008 |
|---|---|---|
| KR | 10-2007-0050260 | 5/2007 |
| KR | 10-2009-0076659 | 7/2009 |

(Continued)

*Primary Examiner* — Christine A Enad
(74) *Attorney, Agent, or Firm* — F. Chau & Associates, LLC

(57) ABSTRACT

An organic light-emitting display apparatus includes a substrate that includes an insulating layer, a display unit disposed on the substrate, an encapsulation member that covers the display unit, and a sealing member disposed on a non-display area of the substrate outside the display unit and between the substrate and the encapsulation member. The insulating layer comprises a first portion that corresponds to the non-display area, and comprises at least one groove formed in the first portion that extends in a direction that is not parallel to an extension direction of the sealing member. The sealing member substantially fills the at least one groove.

20 Claims, 12 Drawing Sheets

(56) References Cited

U.S. PATENT DOCUMENTS

2016/0226016 A1\* 8/2016 Hong ................. H01L 51/5246
2017/0090233 A1\* 3/2017 Xu ...................... G02F 1/13394

FOREIGN PATENT DOCUMENTS

| KR | 10-2015-0011235 | 1/2015 |
| KR | 10-2015-0081006 | 7/2015 |
| KR | 10-2017-0116643 | 10/2017 |

\* cited by examiner

ORGANIC LIGHT-EMITTING DISPLAY APPARATUS

CROSS-REFERENCE TO RELATED APPLICATION

This application claims priority under 35 U.S.C. § 119 from, and the benefit of, Korean Patent Application No. 10-2017-0115907, filed on Sep. 11, 2017 in the Korean Intellectual Property Office, the contents of which are herein incorporated by reference in their entirety.

BACKGROUND

1. Technical Field

One or more embodiments are directed to an organic light-emitting display apparatus.

2. Discussion of the Related Art

In general, a display unit of an organic light-emitting display apparatus degrades due to moisture penetration. Accordingly, an encapsulation structure that seals and protects the display unit is used to prevent moisture penetration. An encapsulation member that covers a substrate that includes a display unit, and a sealing member, such as a frit, filled between the substrate and the encapsulation member, has been used as an encapsulation structure. That is, sealing is achieved by coating the frit around the display unit of the substrate, covering the display unit with the encapsulation member, and curing the frit by applying a laser beam.

Stronger adhesion is achieved by forming a groove called a trap in an insulating film on the substrate, filling the frit in the groove, and curing the filled frit to increase an adhesive force of the sealing member.

SUMMARY

According to exemplary embodiments, a groove is formed through etching using a photoresist. However, due to process variations, the groove is not always formed at the same position and a position of the groove may slightly change whenever a process is performed. In this case, when a sealing member such as a frit is applied to a substrate, the entire groove may not be filled with the sealing member and a part of the groove may be exposed. In this case, when a residue of a layer removed during etching performed to form the groove remains in the groove and a laser beam is directly irradiated into the residue, gas and air bubbles may be generated.

That is, according to embodiments, in a process of covering the groove with a sealing member such as a frit and irradiating a laser beam to cure the sealing member, when a part of the groove is exposed without being covered by the sealing member, a residue around the groove to which the laser is directly irradiated can generate air bubbles, thereby not only marring the appearance of a sealing member line but also causing errors in positioning the sealing member line.

One or more embodiments include an organic light-emitting display apparatus that suppress aesthetic degradation or sealing member line positioning errors due to air bubbles generated in a groove.

Additional features will be set forth in part in the description which follows and, in part, will be apparent from the description, or may be learned by practice of the presented embodiments.

According to one or more embodiments, an organic light-emitting display apparatus includes: a substrate; an insulating layer disposed on the substrate; a display unit disposed on the insulating layer; an encapsulation member that covers the display unit; and a sealing member disposed on a non-display area of the substrate outside the display unit and between the substrate and the encapsulation member, wherein the insulating layer includes a first portion that corresponds to the non-display area, and includes at least one groove formed in the first portion that extends in a direction that is not parallel to an extension direction of the sealing member.

The insulating layer may include a second portion that corresponds to the display unit, wherein the second portion and the first portion of the insulating layer are formed from a same layer.

The display unit may include a buffer layer disposed on the substrate, an active layer disposed on the buffer layer, a gate electrode that faces the active layer, source and drain electrodes disposed over the gate electrode and connected to the active layer, a gate insulating layer disposed between the active layer and the gate electrode, and an interlayer insulating layer disposed between the gate electrode and the source and drain electrodes, wherein the second portion of the insulating layer includes the buffer layer, the gate insulating layer, and the interlayer insulating layer.

The at least one groove may include a plurality of grooves, and each groove may include a first groove and a second groove that are not parallel to each other, wherein ends of the first groove and the second groove meet each other to form a V shape.

The at least groove may include a plurality of grooves, and each groove may include a pair of first grooves and a pair of second grooves that are not parallel to each other, wherein ends of one of the pair of first grooves and one of the pair of second grooves meet each other to form a W shape.

The at least groove may include a plurality of first grooves and a plurality of second grooves that are not parallel to each other, and ends of the plurality of first grooves and the plurality of second grooves alternately meet each other to form a continuous zigzag shape.

The at least groove may include a plurality of grooves, and each groove may include a first groove and a second groove that are not parallel to each other, wherein ends of the first groove and the second groove meet each other to form a rounded V shape in which an inflection portion at which the first groove and the second groove meet each other is rounded.

The at least one groove may include a plurality of grooves, and each groove may include a pair of first grooves and a pair of second grooves that are not parallel to each other, wherein ends of one of the pair of first grooves and one of the pair of second grooves are connected to each other to form a rounded W shape with rounded inflection portions.

The at least one groove may include a plurality of first grooves and a plurality of second grooves that are not parallel to each other, and ends of the plurality of first grooves and the plurality of second grooves are alternately connected to each other to form a continuous wave shape with rounded inflection portions.

The at least one groove may include a plurality of disconnected first grooves and a plurality of disconnected second grooves that alternate with each other, are not to be parallel to the extension direction of the sealing member and are spaced apart from each other.

According to one or more embodiments, an organic light-emitting display apparatus includes: a substrate; a display unit disposed on the substrate; an encapsulation member that covers the display unit; a sealing member disposed between the substrate and the encapsulation member and that extends along a circumference of the display unit; and an insulating layer disposed between the substrate and the sealing member and that includes at least one groove that extends in a direction that is not parallel to an extension direction of the sealing member.

The at least one groove may include a plurality of grooves, and each groove may include a first groove and a second groove that are not parallel to each other, wherein ends of the first groove and the second groove meet each other to form a V shape.

The at least one groove may include a plurality of grooves, and each groove may include a pair of first grooves and a pair of second grooves that are not parallel to each other, wherein ends of one of the pair of first grooves and one of the pair of second grooves meet each other to form a W shape.

The at least one groove may include a plurality of first grooves and a plurality of second grooves that are not parallel to each other, and ends of the plurality of first grooves and the plurality of second grooves alternately meet each other to form a continuous zigzag shape.

The at least one groove may include a plurality of grooves, and each groove may include a first groove and a second groove that are not parallel to each other, wherein ends of the first groove and the second groove meet each other to form a rounded V shape in which an inflection portion at which the first groove and the second groove meet each other is rounded.

The at least one groove may include a plurality of grooves, and each groove may include a pair of first grooves and a pair of second grooves that are not parallel to each other, wherein ends of one of the pair of first grooves and one of the pair of second grooves are connected to each other to form a rounded W shape with rounded inflection portions.

The at least one groove may include a plurality of first grooves and a plurality of second grooves that are not parallel to each other, and ends of the plurality of first grooves and the plurality of second grooves are alternately connected to each other to form a continuous wave shape with rounded inflection portions.

The at least one groove may include a plurality of disconnected first grooves and a plurality of disconnected second grooves that are not parallel to the extension direction of the sealing member and are spaced apart from each other.

According to one or more embodiments, a method of manufacturing an organic light-emitting display apparatus includes the steps of: forming a display unit on a substrate; forming a buffer layer, a gate insulating layer, and an interlayer insulating layer that extend over the substrate to form an insulating layer; forming one or more grooves in the insulating layer through exposure and etching using a photoresist; disposing a sealing member along a circumference of the display unit to fill the one or more grooves; forming an encapsulation member that covers the display unit; and curing the sealing member by irradiating the sealing member with a laser beam, wherein a space between the substrate and the encapsulation member is firmly sealed.

The insulating layer may be an organic insulating layer formed of a polyimide, and the sealing member may be formed of a thermosetting material.

DETAILED DESCRIPTION

Figure 1:
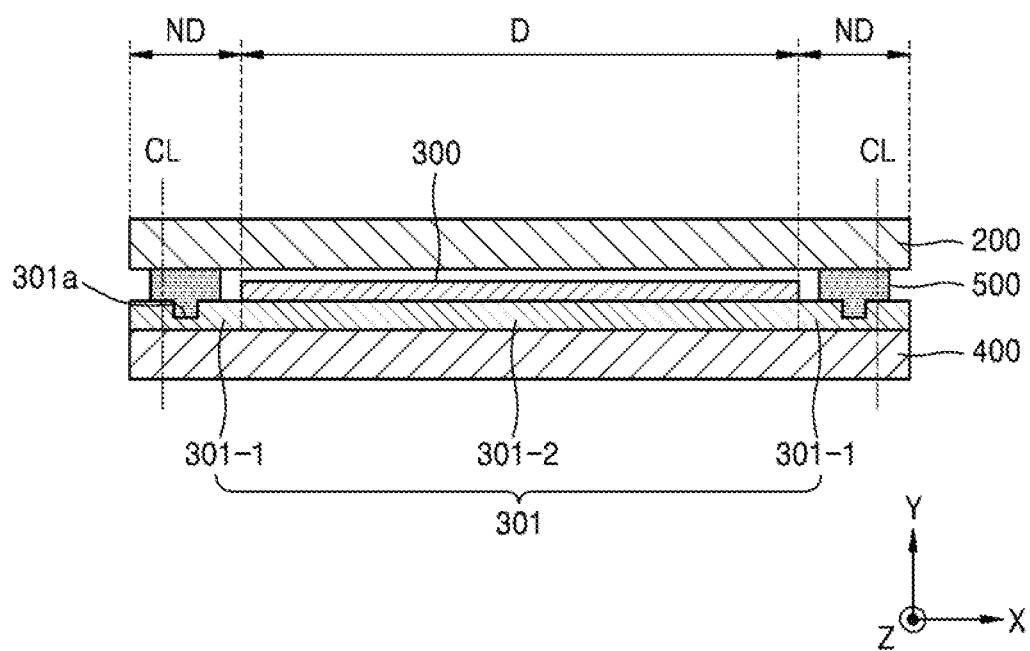
FIG. 1 is a cross-sectional view of an organic light-emitting display apparatus according to an embodiment.

The present disclosure includes various embodiments and modifications, and exemplary embodiments thereof will be illustrated in the drawings and will be described herein in detail. However, embodiments of the present disclosure are not limited to exemplary embodiments described below, and may be embodied in various modes.

In the drawings, the same elements may be denoted by the same reference numerals, and a repeated explanation thereof will not be given.

Sizes of components in the drawings may be exaggerated for convenience of explanation.

Figure 2:
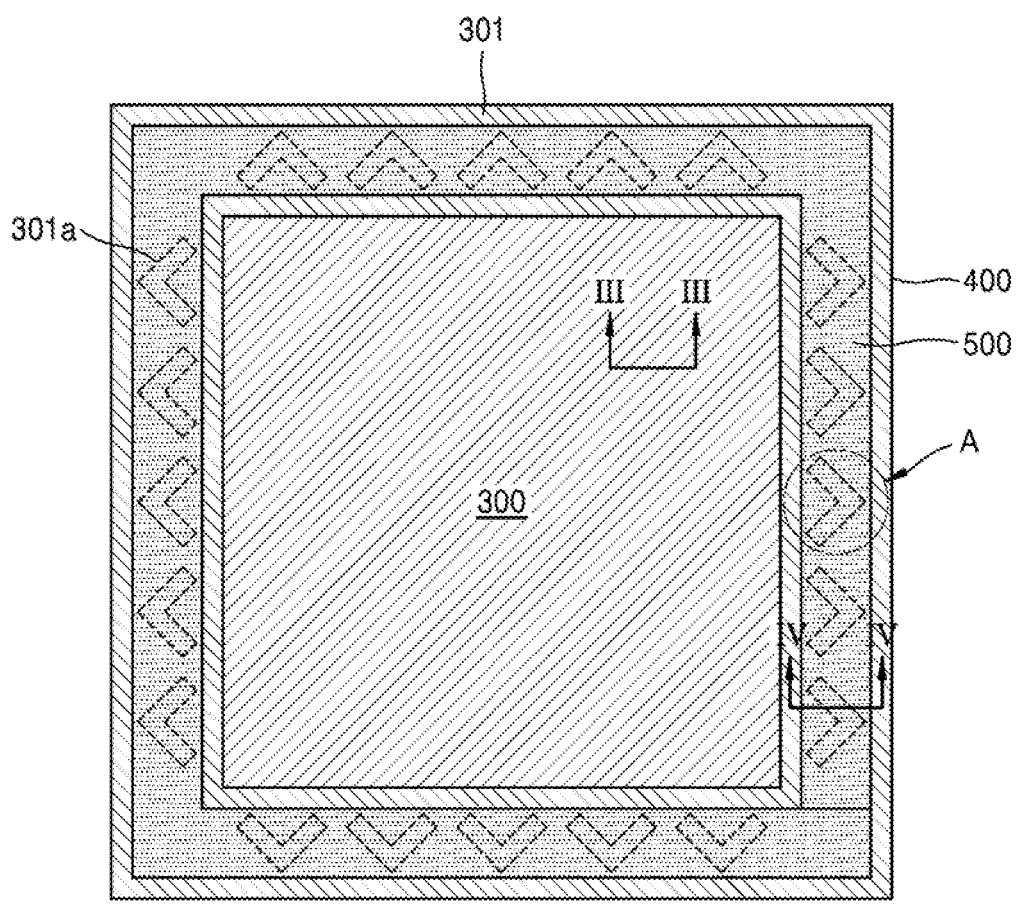
FIG. 2 is a plan view of FIG. 1.

FIGS. 1 and 2 are respectively a cross-sectional view and a plan view of an organic light-emitting display apparatus according to an embodiment.

As shown in FIGS. 1 and 2, an organic light-emitting display apparatus of a present embodiment includes a substrate 400, a display unit 300 disposed on the substrate 400, an encapsulation member 200 that covers the display unit 300, and a sealing member 500 between the substrate 400 and the encapsulation member 200 that surrounds and seals the display unit 300. Reference symbol D denotes a display area of the display unit 300, and reference symbol ND denotes a non-display area outside the display unit 300.

In a present embodiment, an insulating layer 301 is formed on the substrate 400. The insulating layer 301 is formed from a plurality of organic insulating layers, such as a buffer layer 311, a gate insulating layer 313, and an interlayer insulating layer 315, shown in FIG. 3, formed on the display unit 300 that extend outward and contact the sealing member 500. The organic insulating layers, such as the buffer layer 311, the gate insulating layer 313, and the interlayer insulating layer 315, will be described below. The insulating layer 301 includes a first portion 301-1 that corresponds to the non-display area ND and a second portion 301-2 that corresponds to the display area D. The first portion 301-1 and the second portion 301-2 are formed from the same layer.

In a present embodiment, the sealing member 500 is a frit that is cured when irradiated by a laser beam. A plurality of grooves 301a are formed to a predetermined depth in the insulating layer 301 so that the sealing member 500 fills in the groove 301a. That is, a part of the sealing member 500 that fills in each groove 301a is cured. In this case, a contact area with the sealing member 500 is increased, thereby further increasing adhesive forces and maintaining durability against any shearing forces applied in a planar direction, such as an X-Z-axis direction, of FIG. 1.

Figure 5:
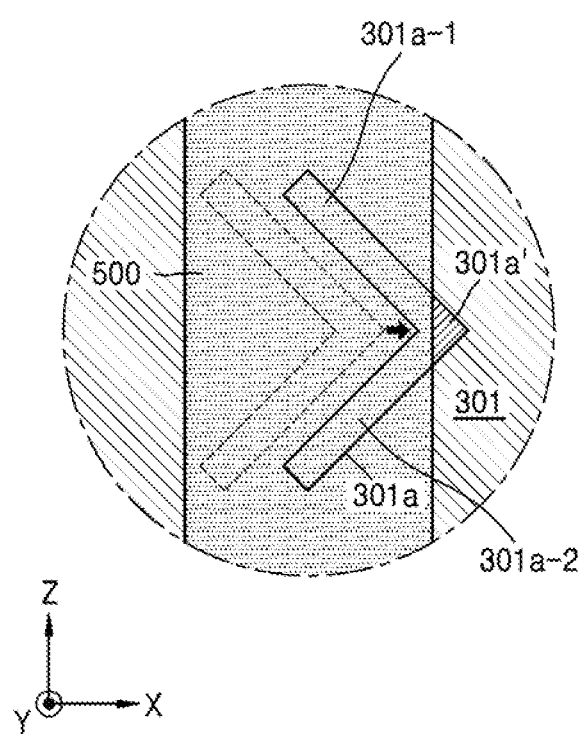
FIG. 5 is an enlarged plan view that illustrates a portion A of FIG. 2.

In a present embodiment, each groove 301a has a V shape in a plan view, as shown in FIG. 2. Although a position of each groove 301a can change due to process variations when the groove 301a is formed, an exposed portion not covered by the sealing member 500 can be minimized. That is, as shown in FIG. 5, when the groove 301a to be formed at a position marked by a dashed line is formed at a position marked by a solid line, an exposed portion 301a' is formed that is not covered by the sealing member 500. However, since the groove 301a is not to parallel to an extension direction, such as the Z-axis direction, of the sealing member 500, the exposed portion 301a', if any, has a very small size. That is, if the groove 301a was formed parallel to the Z-axis direction of FIG. 5, which is a first direction in which the sealing member 500 extends, if the groove 301a is slightly biased as described above, a portion not covered by the sealing member 500 would extend in the Z-axis direction. In this case, the area of the groove 301a to be irradiated by ultraviolet light to cure the sealing member 500 is increased, which increases the probability that air bubbles are generated due to a residue of the insulating layer 301 remaining when the groove 301a is formed. However, since the groove 301a has a V shape that is not parallel to the extension direction of the sealing member 500, even though the exposed portion 301a' is generated due to process variations, the exposed portion 301a', if any, is an extremely small relative to the size of the groove 301a, and thus the probability that air bubbles are generated is very low.

In a present embodiment, referring to FIG. 5, grove 301a includes a first groove 301a-1 and a second groove 301a-2 that are not parallel to each other, and ends of first groove 301a-1 and the second groove 301a-2 meet each other to form the V shape of groove 301a. Neither the first groove 301a-1 nor the second groove 301a-2 are parallel to an extension direction of the sealing member 500 along the circumference of the display unit 300, where the circumference refers to an edge or boundary of the display unit 300. Since the groove 301a has a V shape, the probability that air bubbles are generated due to a residue of the insulating layer 301 is reduced.

Figure 3:
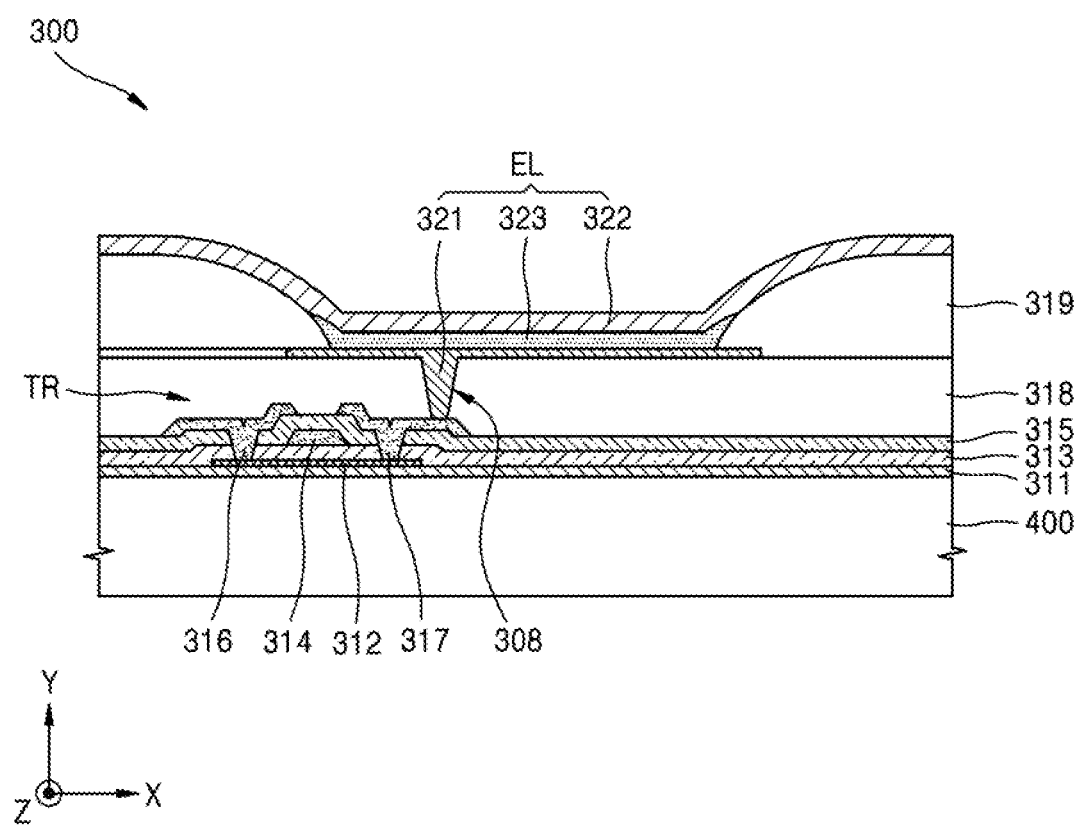
FIG. 3 is a cross-sectional view taken along line III-III of FIG. 2.
Figure 4:
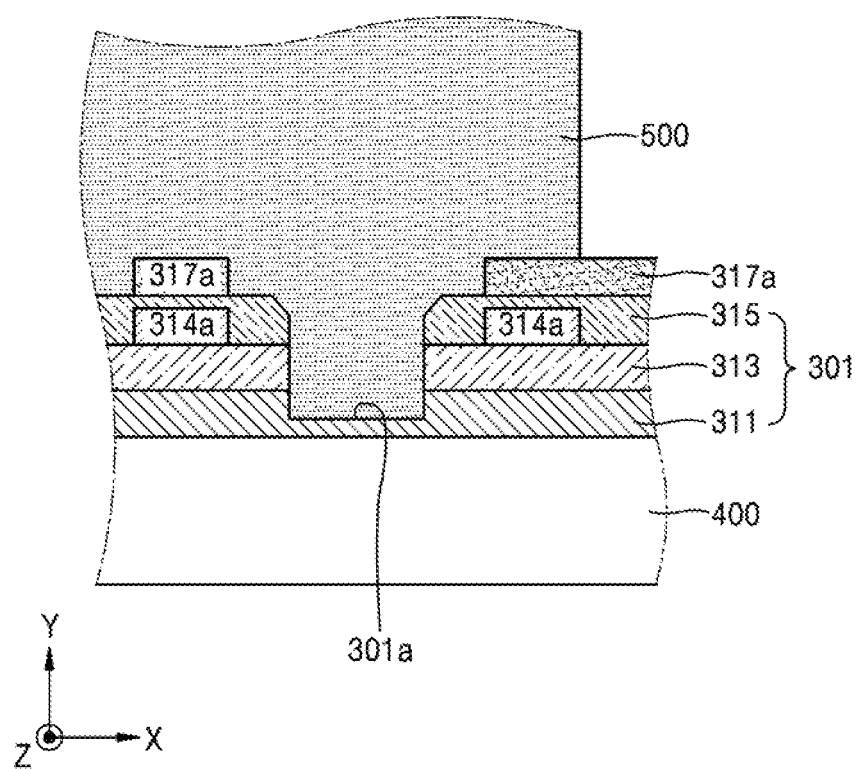
FIG. 4 is a cross-sectional view taken along line IV-IV of FIG. 2.

The structures of the display unit 300 and the insulating layer 301 will now be described with reference to FIGS. 3 to 5. FIG. 3 is a cross-sectional view taken along line I-I of FIG. 2. FIG. 4 is a cross-sectional view taken along line IV-IV of FIG. 2. FIG. 5 is an enlarged plan view that illustrates a portion A of FIG. 2.

In a present embodiment, referring now to FIG. 3, the display unit 300 includes an organic light-emitting element EL in which a pixel electrode 321, an emission layer 323, and a counter electrode 322 are sequentially stacked, and a thin-film transistor TR connected to the pixel electrode 321 of the organic light-emitting element EL.

In a present embodiment, the thin-film transistor TR includes an active layer 312, a gate electrode 314, and source/drain electrodes 316 and 317. A gate insulating layer 313 that insulates the gate electrode 314 and the active layer 312 is disposed between the gate electrode 314 and the active layer 312.

In a present embodiment, the buffer layer is disposed on the substrate 400, and the active layer 312 is disposed on the buffer layer 311. The active layer 312 includes any of various materials. For example, the active layer 312 may include an inorganic semiconductor material such as amorphous silicon or crystalline silicon. Alternatively, the active layer 312 may include an oxide semiconductor. Alternatively, the active layer 312 may include an organic semiconductor material.

In a present embodiment, the gate insulating layer 313 is disposed on the buffer layer 311 to cover the active layer 312, and the gate electrode 314 is disposed on the gate insulating layer 313.

In a present embodiment, the interlayer insulating layer 315 is disposed on the gate insulating layer 313 to cover the gate electrode 314, and the source/drain electrodes 316 and 317 are disposed on the interlayer insulating layer 315 and are connected to the active layer 312.

In a present embodiment, a planarization layer 318 that is an organic insulating layer and that covers the thin-film transistor TR is disposed on the interlayer insulating layer 315. Each of the buffer layer 311, the gate insulating layer 313, the interlayer insulating layer 315, and the planarization layer 318 is formed of a polyimide material.

In a present embodiment, the buffer layer 311, the gate insulating layer 313, and the interlayer insulating layer 315 extend to an outer portion of the display unit 300 to become the insulating layer 301 on the substrate 400, and the grooves 301a are formed in the insulating layer 301 to be filled with the sealing member 500. Referring to FIG. 4, a first wiring layer 314a is formed on the same layer as the gate electrode 314 using the same material as the gate electrode 314, and a second wiring layer 317a is formed on the same layer as the source/drain electrodes 316, 317 by using the same material as that of the source/drain electrodes 316 and 317.

In a present embodiment, the organic light-emitting element EL is disposed on the planarization layer 318, and includes the pixel electrode 321, the emission layer 323, and the counter electrode 322. A pixel-defining layer 319 is disposed on the planarization layer 318 and the pixel electrode 321, and defines a pixel region and a non-pixel region.

The emission layer 323 may be a single layer, or may have a multi-layer structure in which a hole injection layer, a hole transport layer, an electron transport layer, and an electron injection layer are stacked.

In a present embodiment, the pixel electrode 321 is disposed on the planarization layer 318, and is electrically connected to the drain electrode 317 of the thin-film transistor TR through a through-hole 308 that penetrates the planarization layer 318.

In a present embodiment, the pixel electrode 321 functions as an anode, and the counter electrode 322 functions as a cathode. However, embodiments are not limited thereto, and in other embodiments, the pixel electrode 321 can function as a cathode and the counter electrode 322 can function as an anode.

In a present embodiment, the pixel-defining layer 319 has an opening portion through which the pixel electrode 321 is exposed, which defines the pixel region and the non-pixel region of the organic light-emitting element EL. Although only one opening portion is illustrated in FIG. 3, the pixel-defining layer 319 has a plurality of opening portions and the pixel electrode 321, the emission layer 323, and the counter electrode 322 are sequentially stacked in each of the plurality of openings to emit light.

In a present embodiment, the organic light-emitting display apparatus includes a plurality of the organic light-emitting elements EL respectively formed in the plurality of opening portions. Each of the plurality of organic light-emitting elements EL forms one pixel, and each pixel emits one of red, green, blue, or white light. Alternatively, the emission layer 323 can be formed over the entire planarization layer 318 irrespective of pixel positions. In this case, the emission layer 323 is formed by sequentially stacking or mixing layers that include light-emitting materials for emitting red, green, and blue light. Combinations of other colors are possible if white light is emitted. In addition, a color converting layer or a color filter that converts the emitted white light into light of a predetermined color can be further provided.

Figure 6A:
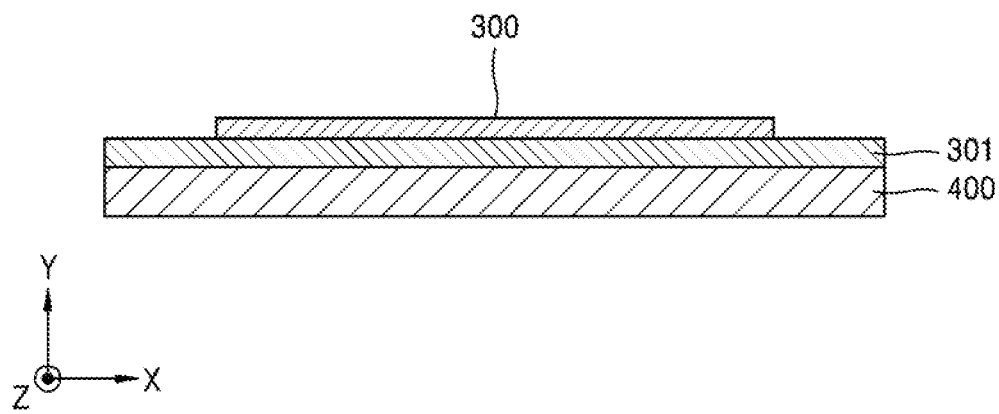
FIGS. 6A through 6C are cross-sectional views that illustrate a process of manufacturing an organic light-emitting display apparatus of FIGS. 1 and 2.
Figure 6B:
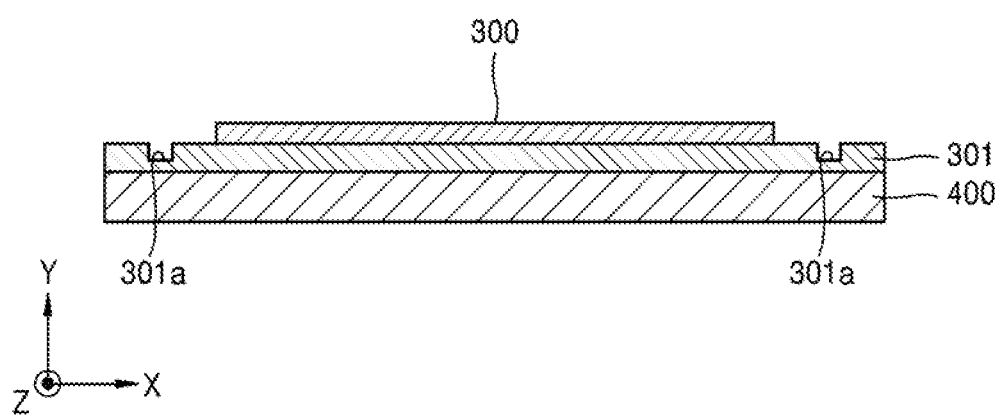
Figure 6C:
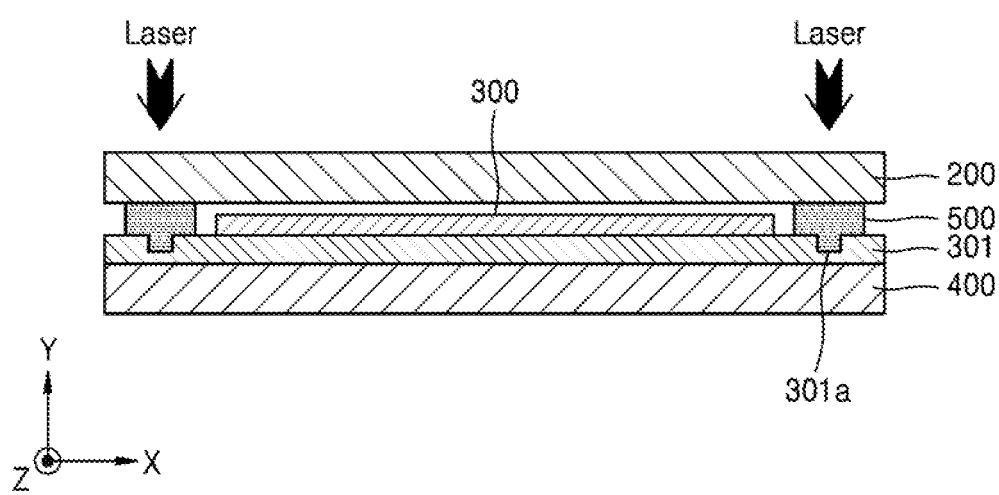

An organic light-emitting display apparatus according to an embodiment can be manufactured using a process of FIGS. 6A to 6C.

First, according to an embodiment, as shown in FIG. 6A, the display unit 300 is formed on the substrate 400. In this process, the buffer layer 311, the gate insulating layer 313, and the interlayer insulating layer 315 extend over the entire substrate 400 to form the insulating layer 301.

In this case, according to an embodiment, the insulating layer 301 is an organic insulating layer formed of a polyimide.

Next, according to an embodiment, as shown in FIG. 6B, the grooves 301a are formed in the insulating layer 301. The grooves 301a are formed through exposure and etching using a photoresist. As shown in FIGS. 2 and 5, the grooves 301a are formed to have a V shape in a plan view of the display unit 300. That is, ends of the first groove 301a-1 and the second groove 301a-2 meet each other to form the V-shaped groove 301a. In this case, a small amount of insulating layer 301 residue that is removed by the etching may remain in the groove 301a.

Next, according to an embodiment, as shown in FIG. 6C, the sealing member 500 is disposed along the circumference of the display unit 300 to fill the groove 301a, the encapsulation member 200 is disposed that covers the display unit 300, and then the sealing member 500 is cured by irradiating a laser beam. The sealing member 500 is formed of a thermosetting material, such as a frit, and as the sealing member 500 is cured, a space between the substrate 400 and the encapsulation member 200 is firmly sealed.

In this case, according to an embodiment, even when a groove 301a is slightly shifted from an originally intended position due to a process variation, since the groove 301a is not parallel to an extension direction of the sealing member 500, only a small exposed portion 301a' is exposed. Accordingly, the probability that a laser beam is directly irradiated onto the insulating layer 301 residue to generate air bubbles is very low.

Hence, according to an embodiment, since the grooves 301a are not parallel to an extension direction of the sealing member 500 that surrounds the display unit 300, if a part of the groove 301a is exposed due to process variations, only a small portion is exposed, thereby preventing air bubbles from being generated. Accordingly, aesthetic degradation due to air bubbles in the groove 301a can be reduced and positioning errors of the sealing member line due to the air bubbles can be suppressed. In addition, since the grooves 301a extend in a direction that latches the X-Z-axis direction, the grooves 301a provide high durability against a shearing forces applied in the X-Z-axis direction. As a result, both the production process and product quality may be improved.

Figure 7:
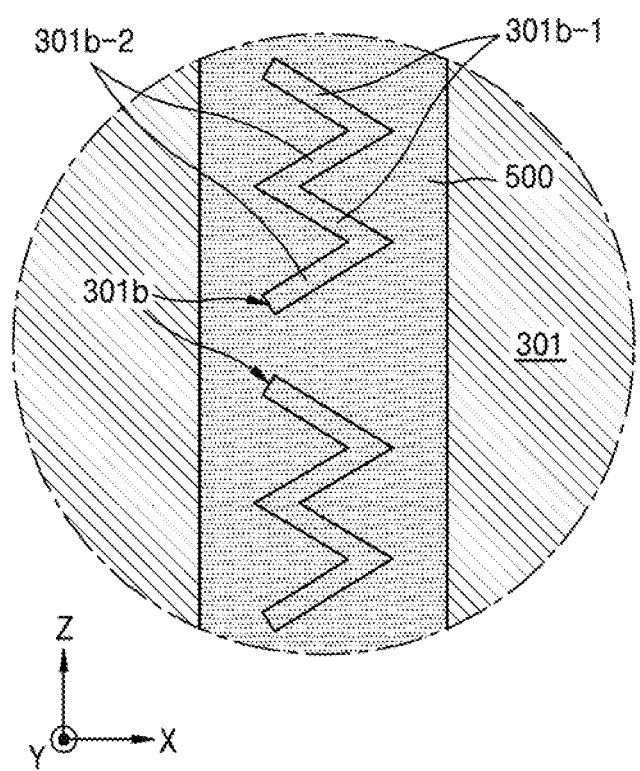
FIGS. 7 through 12 are plan views of modifications of a groove of FIG. 2.

Although the grooves 301a have a V shape in a present embodiment, according to another embodiment, grooves 301b have a W shape as shown in FIG. 7. That is, W-shaped grooves 301b are formed when ends of a pair of first grooves 301b-1 and a pair of second grooves 301b-2 that are not parallel to each other alternately meet each other. Although the grooves 301b have a different shape from that of the grooves 301a, the grooves 301b are not parallel to an extension direction of the sealing member 500, so that a size of the exposed portion is minimized even when a position of the groove 301b is shifted, as described above.

Figure 8:
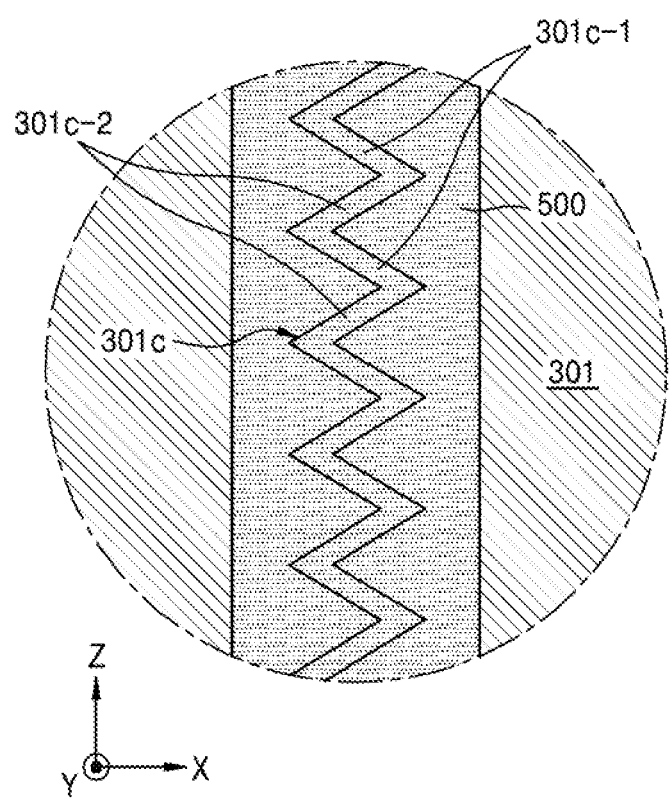

In addition, in another embodiment, as shown in FIG. 8, a groove 301c has a zigzag shape that is continuous along the circumference of the display unit 300 without any spaces between adjacent grooves, where a zigzag shape is a linear pattern made from a plurality of line segments connected at corners with variable angles that trace a path between two parallel lines. That is, the zigzag-shaped groove 301c is formed when ends of a plurality of first grooves 301c-1 and a plurality of second grooves 301c-2 not parallel to each other are alternately connected to each other. Likewise, since the first grooves 301c-1 and second grooves 301c-2 are not parallel to an extension direction of the sealing member 500, the size of any exposed portions is minimized even when a position of the groove 301c is shifted. Since an area filled with the sealing member 500 is increased, an adhesive force is further increased.

Figure 9:
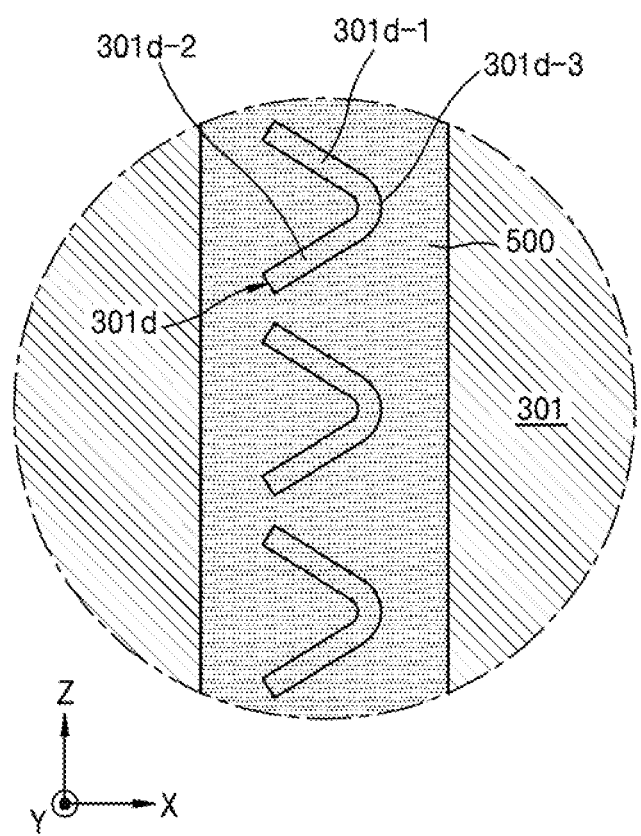
Figure 10:
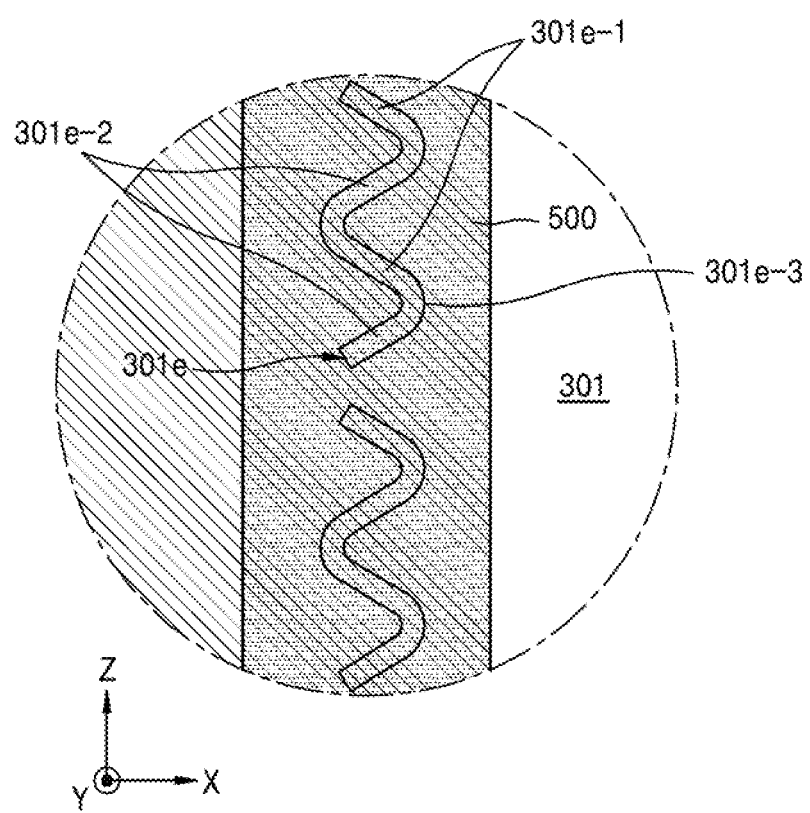
Figure 11:
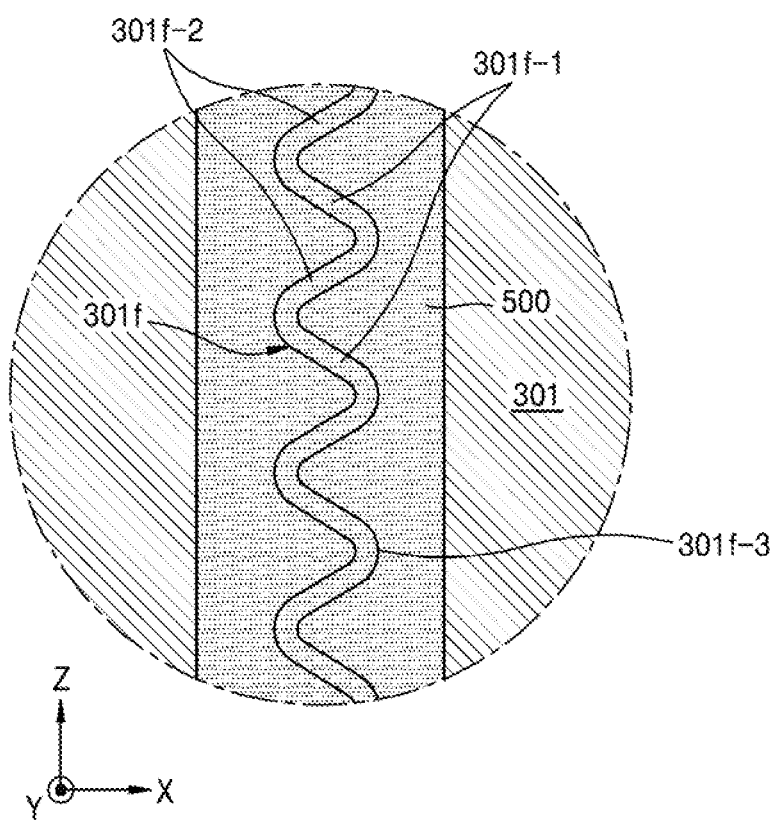
Figure 12:
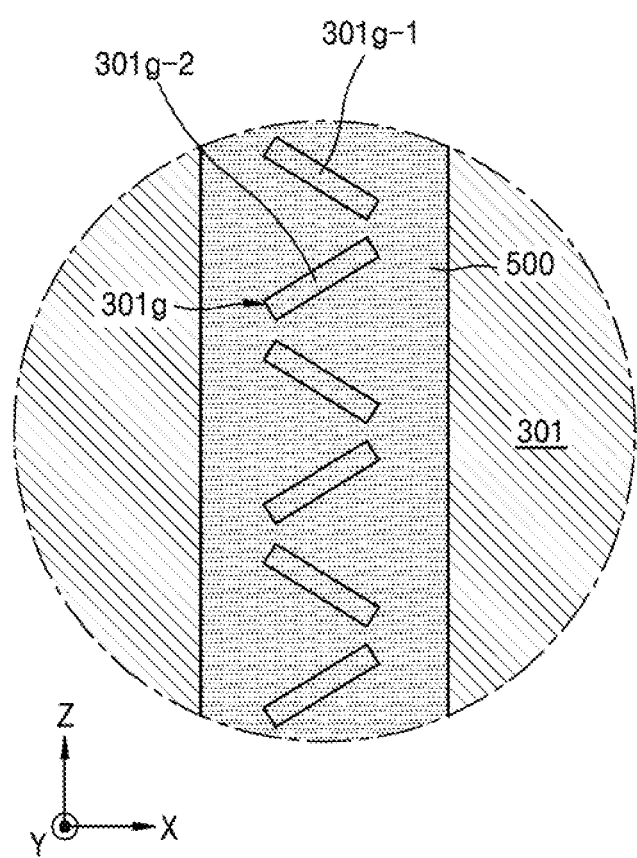

According to another embodiment, FIG. 9 illustrates a groove 301d formed by processing a structure of FIG. 5 so that an inflection point at which a first groove 301d-1 and a second groove 301d-2 meet each other is rounded. According to yet another embodiment, FIG. 10 illustrates a groove 301e formed by processing a structure of FIG. 7 so that inflection points 301e-3 at which first grooves 301e-1 and second grooves 301e-2 meet each other is rounded. According to yet another embodiment, FIG. 11 illustrates a wave-shaped groove 301f formed by processing a structure of FIG. 8 so that an inflection points 301f-3 at which first grooves 301f-1 and second grooves 301f-2 meet each other is rounded. In addition, according to yet another embodiment, FIG. 12 illustrates a groove 301g formed from alternating diagonally oriented first grooves 301g-1 and second grooves 301g-2 disconnected from each other by separating the first groove 301g-1 and the second groove 301g-2 at an inflection region. Although various modifications are made as described above, an exposed portion can be minimized even when a position of any of the grooves 301d, 301e, 301f, and 301g is shifted.

According to embodiments, as described above, an organic light-emitting display apparatus can suppress aesthetic degradation and a sealing member line positioning errors due to air bubbles generated in a groove, thereby improving both production process and product quality.

While one or more exemplary embodiments have been described with reference to the figures, it will be understood by one of ordinary skill in the art that various changes in form and details may be made therein without departing from the spirit and scope as defined by the following claims.

What is claimed is:

1. An organic light-emitting display apparatus, comprising:
    a substrate;
    an insulating layer disposed on the substrate;
    a display unit disposed on the insulating layer;
    an encapsulation member that covers the display unit; and
    a sealing member disposed on a non-display area of the substrate outside the display unit and between the substrate and the encapsulation member,
    wherein the insulating layer comprises a first portion that corresponds to the non-display area, and comprises at least one groove formed in the first portion that extends in a direction that is not parallel and not perpendicular to an extension direction of the sealing member, and is completely covered by the sealing member, wherein the groove is a diagonal pattern symmetrical to a direction perpendicular to the extension direction of the sealing member, and the groove comprises a plurality of grooves along a circumference of the display unit.

2. The organic light-emitting display apparatus of claim 1, wherein the insulating layer comprises a second portion that corresponds to the display unit,
wherein the second portion and the first portion of the insulating layer are formed from a same layer.

3. The organic light-emitting display apparatus of claim 2, wherein the display unit comprises
a buffer layer disposed on the substrate,
an active layer disposed on the buffer layer,
a gate electrode that faces the active layer,
source and drain electrodes disposed over the gate electrode and connected to the active layer,
a gate insulating layer disposed between the active layer and the gate electrode, and
an interlayer insulating layer disposed between the gate electrode and the source and drain electrodes,
wherein the second portion of the insulating layer includes the buffer layer, the gate insulating layer, and the interlayer insulating layer.

4. The organic light-emitting display apparatus of claim 1, wherein the at least one groove comprises a plurality of grooves, and
each groove includes a first groove and a second groove that are not parallel to each other,
wherein ends of the first groove and the second groove meet each other to form a V shape.

5. The organic light-emitting display apparatus of claim 1, wherein the at least one groove comprises a plurality of grooves, and
each groove includes a pair of first grooves and a pair of second grooves that are not parallel to each other,
wherein ends of one of the pair of first grooves and one of the pair of second grooves meet each other to form a W shape.

6. The organic light-emitting display apparatus of claim 1, wherein the at least one groove comprises a plurality of first grooves and a plurality of second grooves that are not parallel to each other, and
ends of the plurality of first grooves and the plurality of second grooves alternately meet each other to form a continuous zigzag shape.

7. The organic light-emitting display apparatus of claim 1, wherein the at least one groove comprises a plurality of grooves, and
each groove includes a first groove and a second groove that are not parallel to each other,
wherein ends of the first groove and the second groove meet each other to form a rounded V shape in which an inflection portion at which the first groove and the second groove meet each other is rounded.

8. The organic light-emitting display apparatus of claim 1, wherein the at least one groove comprises a plurality of grooves, and
each groove includes a pair of first grooves and a pair of second grooves that are not parallel to each other,
wherein ends of one of the pair of first grooves and one of the pair of second grooves are connected to each other to form a rounded W shape with rounded inflection portions.

9. The organic light-emitting display apparatus of claim 1, wherein the at least one groove comprises a plurality of first grooves and a plurality of second grooves that are not parallel to each other, and
ends of the plurality of first grooves and the plurality of second grooves are alternately connected to each other to form a continuous wave shape with rounded inflection portions.

10. The organic light-emitting display apparatus of claim 1,
wherein the at least one groove comprises a plurality of disconnected first grooves and a plurality of disconnected second grooves that alternate with each other, are not parallel to the extension direction of the sealing member and are spaced apart from each other.

11. An organic light-emitting display apparatus, comprising:
a substrate;
a display unit disposed on the substrate;
an encapsulation member that covers the display unit;
a sealing member disposed between the substrate and the encapsulation member and that extends along a circumference of the display unit; and
an insulating layer disposed between the substrate and the sealing member and that includes at least one groove that extends in a direction that is not parallel and not perpendicular to an extension direction of the sealing member, and is completely covered by the sealing member, wherein the groove is a diagonal pattern symmetrical to a direction perpendicular to the extension direction of the sealing member, and the groove comprises a plurality of grooves along a circumference of the display unit.

12. The organic light-emitting display apparatus of claim 11,
wherein the at least one groove comprises a plurality of grooves, and
each groove includes a first groove and a second groove that are not parallel to each other,
wherein ends of the first groove and the second groove meet each other to form a V shape.

13. The organic light-emitting display apparatus of claim 11,
wherein the at least one groove comprises plurality of grooves, and
each groove includes a pair of first grooves and a pair of second grooves that are not parallel to each other,
wherein ends of one of the pair of first grooves and one of the pair of second grooves meet each other to form a W shape.

14. The organic light-emitting display apparatus of claim 11,
wherein the at least one groove comprises a plurality of first grooves and a plurality of second grooves that are not parallel to each other, and
ends of the plurality of first grooves and the plurality of second grooves alternately meet each other to form a continuous zigzag shape.

15. The organic light-emitting display apparatus of claim 11,
wherein the at least one groove comprises a plurality of grooves, and
each groove includes a first groove and a second groove that are not parallel to each other,
wherein ends of the first groove and the second groove meet each other to form a rounded V shape in which an inflection portion at which the first groove and the second groove meet each other is rounded.

16. The organic light-emitting display apparatus of claim 11, wherein the at least one groove comprises a plurality of grooves, and each groove includes a pair of first grooves and a pair of second grooves that are not parallel to each other, wherein ends of one of the pair of first grooves and one of the pair of second grooves are connected to each other to form a rounded W shape with rounded inflection portions.

17. The organic light-emitting display apparatus of claim 11, wherein the at least one groove comprises a plurality of first grooves and a plurality of second grooves that are not parallel to each other, and ends of the plurality of first grooves and the plurality of second grooves are alternately connected to each other to form a continuous wave shape with rounded inflection portions.

18. The organic light-emitting display apparatus of claim 11, wherein the at least one groove comprises a plurality of disconnected first grooves and a plurality of disconnected second grooves that alternate with each other, are not parallel to the extension direction of the sealing member and are spaced apart from each other.

19. A method of manufacturing an organic light-emitting display apparatus, comprising the steps of:

forming a display unit on a substrate, forming a buffer layer, a gate insulating layer, and an interlayer insulating layer that extend over the substrate to form an insulating layer;

forming one or more grooves in the insulating layer through exposure and etching using a photoresist;

disposing a sealing member along a circumference of the display unit to fill the one or more grooves, wherein the one or more grooves extend in a direction that is not parallel and not perpendicular to an extension direction of the sealing member, wherein the groove is a diagonal pattern symmetrical to a direction perpendicular to the extension direction of the sealing member, and the groove comprises a plurality of grooves along a circumference of the display unit;

forming an encapsulation member that covers the display unit; and curing the sealing member by irradiating the sealing member with a laser beam, wherein a space between the substrate and the encapsulation member is firmly sealed.

20. The method of claim 19, wherein the insulating layer is an organic insulating layer formed of a polyimide, and the sealing member is formed of a thermosetting material.

* * * * *